US007965300B2

(12) United States Patent
Feng

(10) Patent No.: US 7,965,300 B2
(45) Date of Patent: Jun. 21, 2011

(54) METHODS AND SYSTEMS FOR EFFICIENT WHITE BALANCE AND GAMMA CONTROL

(75) Inventor: Xiao-Fan Feng, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 887 days.

(21) Appl. No.: 11/941,074

(22) Filed: Nov. 15, 2007

(65) Prior Publication Data

US 2009/0128578 A1 May 21, 2009

(51) Int. Cl.

| | |
|---|---|
| ***G09G 5/00*** | (2006.01) |
| ***G09G 5/02*** | (2006.01) |
| ***H04N 17/00*** | (2006.01) |
| ***H04N 1/46*** | (2006.01) |
| ***H04N 5/14*** | (2006.01) |
| ***G03F 3/08*** | (2006.01) |
| ***G06K 9/40*** | (2006.01) |
| *H04N 5/202* | (2006.01) |
| *G09G 9/10* | (2006.01) |
| *G06K 9/00* | (2006.01) |
| *G06K 9/32* | (2006.01) |

(52) U.S. Cl. ........ 345/600; 345/690; 345/590; 345/604; 345/606; 348/179; 348/180; 348/254; 348/671; 358/504; 358/516; 358/519; 358/525; 382/167; 382/274; 382/254; 382/300

(58) Field of Classification Search .................. 345/581, 345/589, 590, 591, 600–601, 604, 606, 610, 345/619, 643, 549, 547, 690; 348/68–71, 348/179–180, 182, 223, 227, 254, 386, 441, 348/469, 488, 557–560, 671, 708; 346/602, 346/655

See application file for complete search history.

(56) References Cited

U.S. PATENT DOCUMENTS

| | | | | |
|---|---|---|---|---|
| 5,452,019 | A * | 9/1995 | Fukuda et al. | 348/655 |
| 6,075,563 | A * | 6/2000 | Hung | 348/223.1 |
| 6,285,350 | B1 | 9/2001 | Ijntema et al. | |
| 6,775,633 | B2 | 8/2004 | Edge | |
| 6,844,881 | B1 | 1/2005 | Chen et al. | |
| 7,215,343 | B2 | 5/2007 | Edge | |
| 2004/0146663 | A1* | 7/2004 | Paukshto et al. | 428/1.31 |
| 2007/0273939 | A1* | 11/2007 | Kishida et al. | 358/504 |

* cited by examiner

*Primary Examiner* — Wesner Sajous

(74) *Attorney, Agent, or Firm* — Krieger Intellectual Property, Inc.; Scott C. Krieger

(57) ABSTRACT

Elements of the present invention relate to systems and methods for determining device white point and gamma correction curve characteristics.

20 Claims, 6 Drawing Sheets

METHODS AND SYSTEMS FOR EFFICIENT WHITE BALANCE AND GAMMA CONTROL

FIELD OF THE INVENTION

Embodiments of the present invention comprise methods and systems for efficient white balance and gamma control of liquid crystal displays (LCDs).

BACKGROUND

A typical LCD display comprises an array of pixels, which are subdivided into sub-pixels that correspond to red, green and blue colors. Each sub-pixel may be addressed with a value that varies the intensity of that color. Various combinations of sub-pixel value can be used to create different colors. Typically, when all sub-pixels are addressed at somewhere near their maximum values, the color white is produced. However, different viewers may have a different perception of what white should look like. Also, various applications may require different "shades" of white to appear natural or to reproduce the light of a particular scene. For these reasons and others, the values that create a "white" pixel color may need to be adjusted. This process may be called a "white balance" process.

While some displays, such as television displays, used for casual viewing may not require precise white balance adjustment, displays used for professional purposes, such as colorimetric displays and displays used for benchmark comparison, require precise white balance adjustment. FIG. 1 shows a delta E error for a correctly adjusted display 2 and for a display with an incorrect white point 4.

SUMMARY

Some embodiments of the present invention comprise systems and methods for improving white balance processes by controlling the gamma table of the three primary color channels. These embodiments may provide white balance control as well as independent control of color channel gamma curves. Some embodiments may comprise a calibration step to control the chromaticity of the white point.

BRIEF DESCRIPTION OF THE SEVERAL DRAWINGS

DETAILED DESCRIPTION OF EXEMPLARY EMBODIMENTS

Embodiments of the present invention will be best understood by reference to the drawings, wherein like parts are designated by like numerals throughout. The figures listed above are expressly incorporated as part of this detailed description.

It will be readily understood that the components of the present invention, as generally described and illustrated in the figures herein, could be arranged and designed in a wide variety of different configurations. Thus, the following more detailed description of the embodiments of the methods and systems of the present invention is not intended to limit the scope of the invention but it is merely representative of the presently preferred embodiments of the invention.

Elements of embodiments of the present invention may be embodied in hardware, firmware and/or software. While exemplary embodiments revealed herein may only describe one of these forms, it is to be understood that one skilled in the art would be able to effectuate these elements in any of these forms while resting within the scope of the present invention.

Some embodiments of the present invention relate to devices that display, measure or reproduce color with multiple color channels. Some embodiments may relate to reproduction devices, such as scanners and cameras, which quantize and record colors detected on media. Some embodiments may comprise display devices, such as Cathode Ray Tube (CRT) monitors and Liquid Crystal Display (LCD) devices, which display color images that have been digitized.

Figure 1:
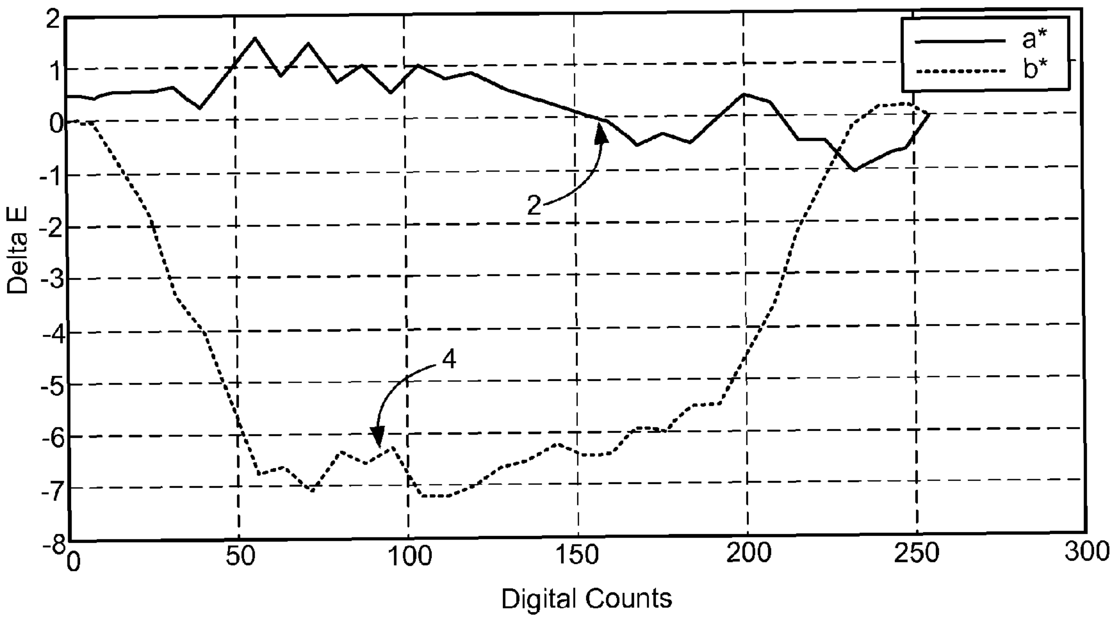
FIG. 1 is a graph showing a large delta E error due to an incorrect white point.
Figure 2:
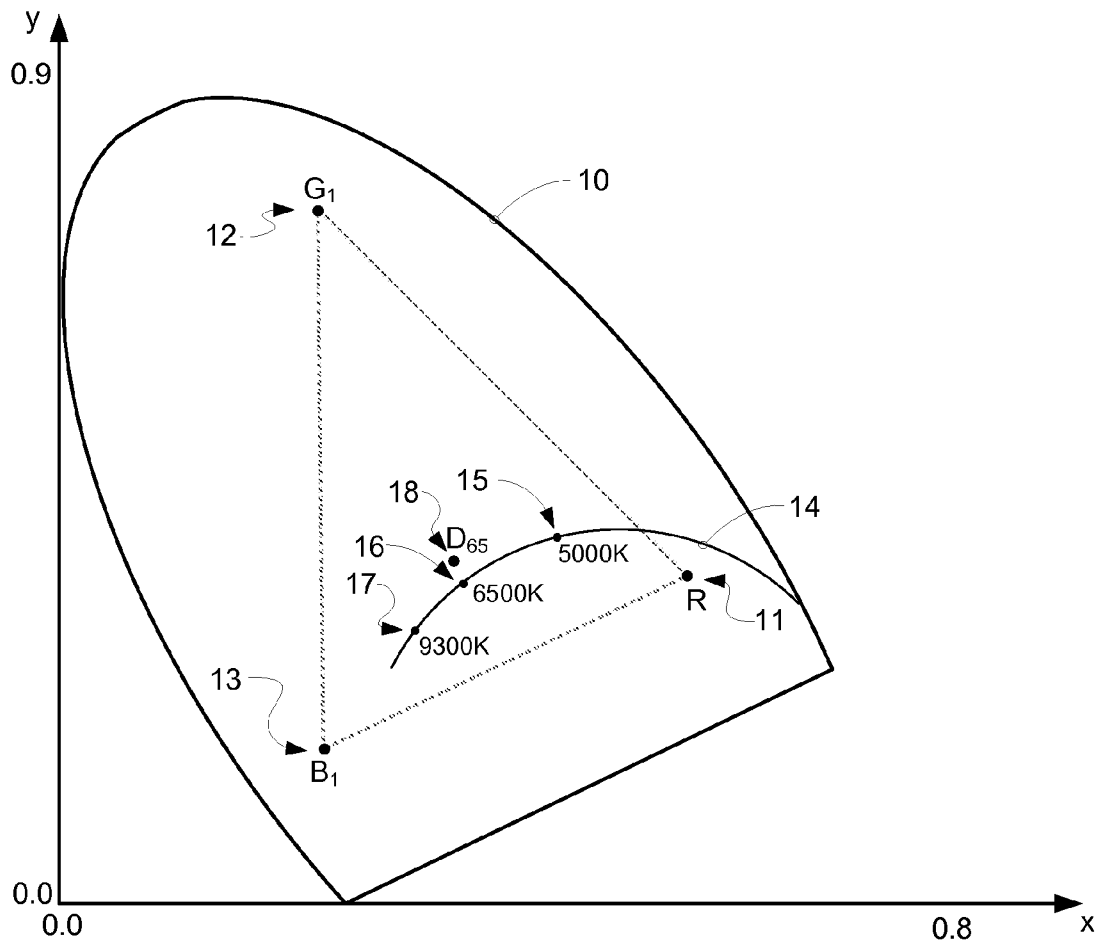
FIG. 2 is a diagram showing a typical color space with common reference white points.

Colors used in these devices may be characterized by coordinates in a standard color space. An exemplary color space is illustrated by the CIE (Commission Internationale d'Eclairage) 1931 chromaticity diagram, shown in FIG. 2. In this diagram, the horseshoe-shaped color space 10 represents the colors observed by a standard viewer. The triangle formed by the points R 11, G 12 and B 13 represents the scope of the colors that can be reproduced or detected by a particular device. A "black body curve" 14 is also shown to illustrate the colors emitted from a theoretical "black body" at different absolute temperatures, typically expressed in degrees Kelvin. Points along the black body curve 14 at various exemplary temperatures: 5000K 15, 6500K 16 and 9300K 17 are shown. Theoretically, the black body radiates "white" light with varying hues at different temperatures. Relatively lower temperatures (e.g. 5000K) are associated with reddish hues, relatively higher temperatures (e.g., 9300K) are associated with bluish hues. The light emitted from the black body at 6500K 16 is often used as a standard white metric. The reference white 18 used by the NTSC television standard is referred to as "Daylight 65," abbreviated $D_{65}$, and is found slightly above and to the left of the 6500K white point 16. Other points may also be selected as reference white points for particular standards, devices or other purposes. Some embodiments of the present invention may utilize a target or reference white point to which a display or other device may be adjusted or calibrated.

Some embodiments of the present invention comprise methods and systems for deriving a color mixing model for a display or other device. For a display device, this may be performed by displaying the primary colors, e.g., red, green and blue, as well as black and white and measuring the displayed output with a calorimeter. In some embodiments, matrices may be derived from the measured output. In some embodiments, one matrix may represent the conversion from normalized RGB values to XYZ values and another matrix may represent the conversion from XYZ to normalized RGB. These matrices are shown as equations 1 and 2 below.

$$\begin{bmatrix} X \\ Y \\ Z \end{bmatrix} = \begin{bmatrix} X_r & X_g & X_b \\ Y_r & Y_g & Y_b \\ Z_r & Z_g & Z_b \end{bmatrix} \begin{bmatrix} R \\ G \\ B \end{bmatrix} - 2 \begin{bmatrix} X_{leak} \\ Y_{leak} \\ Z_{leak} \end{bmatrix} \quad (1)$$

$$\begin{bmatrix} R \\ G \\ B \end{bmatrix} = \begin{bmatrix} X_r & X_g & X_b \\ Y_r & Y_g & Y_b \\ Z_r & Z_g & Z_b \end{bmatrix}^{-1} \left( \begin{bmatrix} X \\ Y \\ Z \end{bmatrix} + 2 \begin{bmatrix} X_{leak} \\ Y_{leak} \\ Z_{leak} \end{bmatrix} \right) \quad (2)$$

In some embodiments, the tone scale or gamma curve of a device may be measured to determine the appropriate gamma value to be used for the device. However, for many devices, such as LCD displays for personal computers or televisions, a gamma of 2.2 may be assumed. Other gamma values may be standard for other applications as well.

Some embodiments of the present invention comprise white point calibration or white point determination, wherein the brightest driving values that will produce the reference white point's chromaticity are determined. In some embodiments, the color produced when all color channels are displayed at maximum values, e.g. r=255, g=255, b=255, is displayed and the display is measured with a colorimeter. If the chromaticity is not within a given tolerance of the target chromaticity, an iterative loop may be used to find the maximum color values that will produce the target chromaticity.

Figure 3:
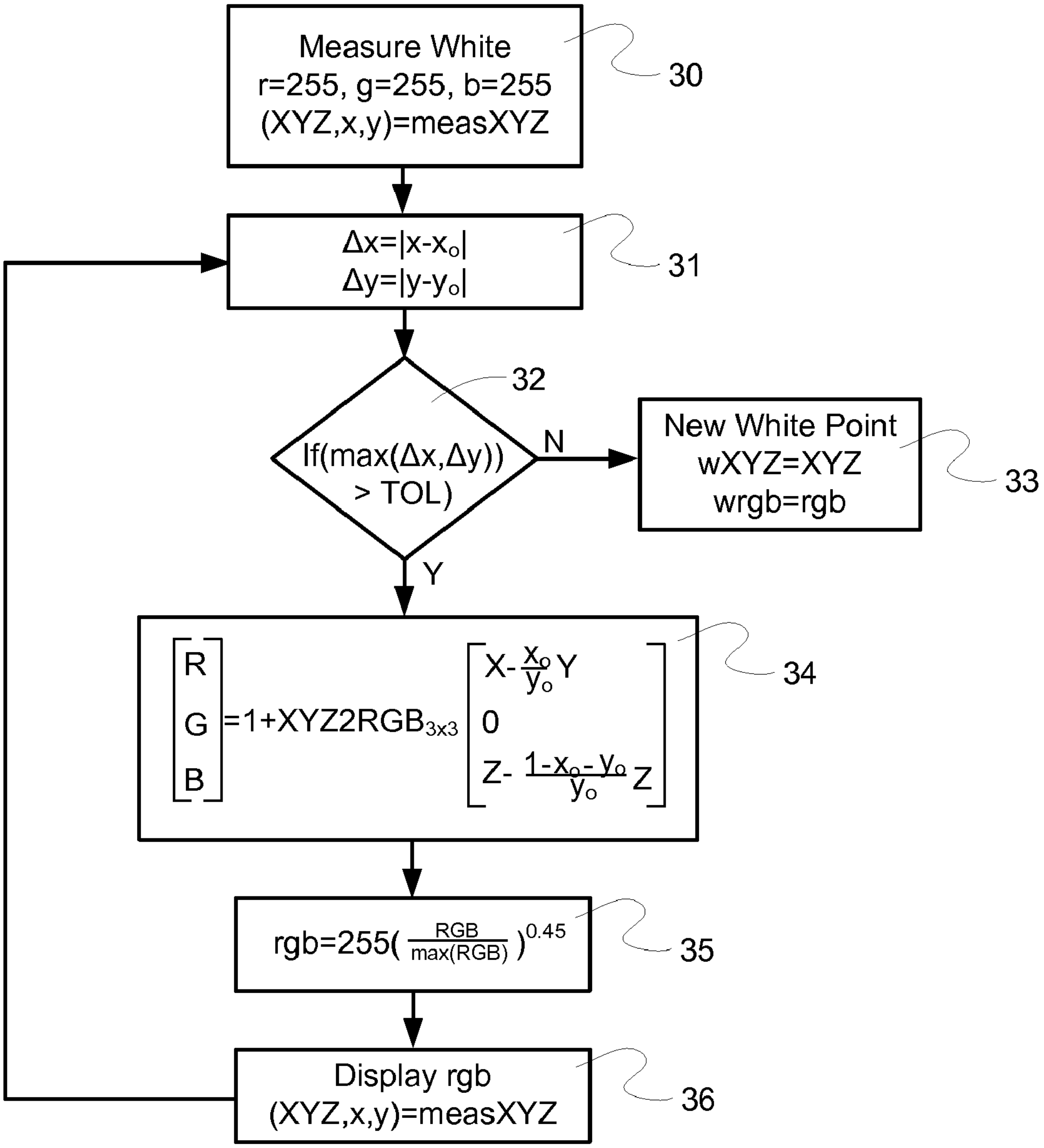
FIG. 3 is a flow chart showing an embodiment of the present invention comprising determination of a device white point.

Some embodiments of the present invention may be described with reference to FIG. 3. In these embodiments, the maximum values for each color channel (e.g., red, green and blue) of a display are displayed on the display. This will generally produce the brightest white for which the display is capable. However, this "white" may not have the same chromaticity as a reference "white" that has been selected. Accordingly, some color channel values may need to be adjusted to bring the displayed color within a chromaticity tolerance of the reference white point's chromaticity. Once the maximum values are displayed, the display output may be measured 30 with a calorimeter or similar device to determine measured chromaticity coordinates. The differences between the target chromaticity coordinates and the measured chromaticity coordinates may then be determined 31. If the difference between the target chromaticity coordinates and the measured chromaticity coordinates is less than a chromaticity tolerance 32, the displayed color channel code values may be used as the white point code values 33.

If the differences between the target chromaticity coordinates and the measured chromaticity coordinates are more than a chromaticity tolerance 32, the color channel code values may be adjusted 34 to bring the displayed/measured chromaticity closer to the target reference chromaticity. In some embodiments, new color channel code values may be determined by adjusting previous color channel code values in proportion to the differences 31 measured above. In some embodiments, new color channel values may be determined 34 by methods comprising multiplying an XYZ to RGB conversion matrix (e.g., from equation 2) with the column vector shown as equation 3:

$$\begin{bmatrix} X - \frac{x_0}{y_0} Y \\ 0 \\ Z - \frac{(1 - x_0 - y_0)}{y_0} Z \end{bmatrix}. \quad (3)$$

where X, Y and Z are measured values based on the previously displayed color channel values and $x_0$ and $y_0$ are target reference white point chromaticity coordinates.

In some embodiments, new color channel values may be determined 34 with equation 4

$$\begin{bmatrix} R \\ G \\ B \end{bmatrix} = 1 - XYZ2RGB_{3\times3} \begin{bmatrix} X - \frac{x_0}{y_0} Y \\ 0 \\ Z - \frac{(1 - x_0 - y_0)}{y_0} Z \end{bmatrix} \quad (4)$$

wherein R, G and B are linearized color channel values (e.g., $R=(r/255)^{\gamma}$); XYZ2RGB is an XYZ to RGB conversion matrix (e.g., from equation 2); X, Y and Z are measured values based on the previously displayed color channel values and $x_0$ and $y_0$ are target reference point chromaticity coordinates.

In some embodiments, these linearized color channel values may be converted 35 to code domain values for use on the display. In some embodiments this may be performed using equations 5-7.

$$r = 255\left(\frac{R}{\max R}\right)^{\frac{1}{\gamma}} \quad (5)$$

$$g = 255\left(\frac{G}{\max G}\right)^{\frac{1}{\gamma}} \quad (6)$$

$$b = 255\left(\frac{B}{\max B}\right)^{\frac{1}{\gamma}} \quad (7)$$

In some embodiments, these color channel code values may then be displayed 36 and the output measured to determine the chromaticity of the displayed color. The measured values resulting from display of the adjusted color channel code values may then be compared to the target reference chromaticity 31 and the differences may be checked to determine whether they are within tolerance 32. This adjustment process may be repeated until color channel values are found that fall within the specified tolerance thereby determining the color channel values that correspond to the selected white point 33.

Figure 4:
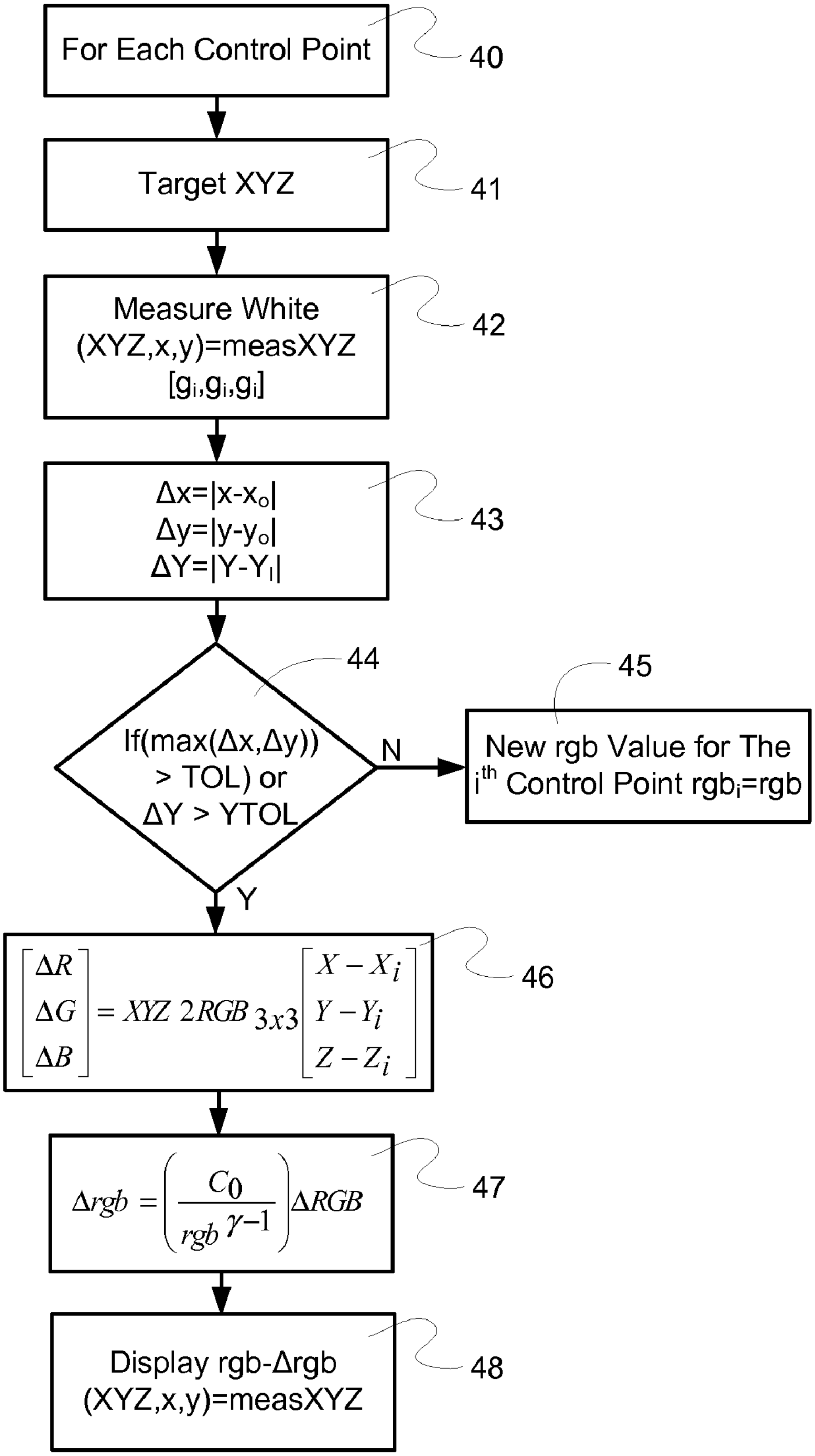
FIG. 4 is a flow chart showing an embodiment of the present invention comprising determination of control point color coordinates.

This process may be repeated for each incremental value along a gamma curve, but such a procedure would be very calculation intensive and time consuming. Therefore, in some embodiments, control points may be selected between which interpolation may be performed to fill in the gaps. If we assign the variable, $gl_i$, to represent the gray level for a control point, the target XYZ values can be obtained with equation 8.

$$\begin{bmatrix} X_i \\ Y_i \\ Z_i \end{bmatrix} = \left(\frac{gl_i}{255}\right)^{\gamma} Y_w \begin{bmatrix} x_0 / y_0 \\ 1 \\ (1 - x_0 - y_0)/y_0 \end{bmatrix} \quad (8)$$

Where $gl_i$ is the gray level of the control point; $X_i$, $Y_i$ and $Z_i$ are target coordinates; $Y_w$ is the luminance value of the reference white point; $\gamma$ is the target gamma value and $x_0$ and $y_0$ are target reference point chromaticity coordinates Once control point intervals are determined, color balance and gamma control may be performed for each control point location. In some embodiments, an iterative process may be used to find a set of rgb values that satisfy chromaticity and gamma constraints. Some embodiments may be described with reference to FIG. 4. In some of these embodiments, a gray level, $gl_i$, selected for a control point may be used as input to equation 8 to determine target X, Y and Z values 41 for the control point 40. The gray level, $gl_i$, of the control point may also be used 42 as the r, g and b coordinates (e.g., $gl_i$=r=g=b) used as a starting point for determination of color balanced coordinates for the control point. These rgb coordinates may be displayed on a display and a calorimeter or other device may be used to determine displayed color.

Differences between the displayed output and the target values may then be determined 43. If one or more or some combination of these differences is less than a given tolerance 44, the color channel code values may be used as the coordinates for the control point 45. If one or more or some combination of these differences is greater than a given tolerance 44, the color channel code values may be adjusted 46 to reduce the differences. In some embodiments, this color channel code value adjustment may comprise multiplying an XYZ to RGB transfer function by a column vector of differences between XYZ target values, $X_i$, $Y_i$ and $Z_i$, and current measured output values, X, Y and Z. In some embodiments, this adjustment may comprise determining linearized color channel difference values. In some embodiments, this process may comprise using equation 9 to calculate linearized color channel difference values.

$$\begin{bmatrix} \Delta R \\ \Delta G \\ \Delta B \end{bmatrix} = XYZ2RGB_{3x3} \begin{bmatrix} X - X_i \\ Y - Y_i \\ Z - Z_i \end{bmatrix} \quad (9)$$

Wherein ΔR, ΔG and ΔB are linearized color channel difference values (e.g., $R=(r/255)^{\gamma}$); XYZ2RGB is an XYZ to RGB conversion matrix (e.g., from equation 2); X, Y and Z are measured values based on the previously displayed color channel values; $X_i$, $Y_i$ and $Z_i$, are control point target values and $x_0$ and $y_0$ are target reference point chromaticity coordinates.

This adjustment may further comprise conversion of the linearized color channel differences, ΔR, ΔG and ΔB, to the code domain 47. In some embodiments, this process may comprise using equations 10-12.

$$\Delta r = \left(\frac{C_0}{r^{\gamma-1}}\right)\Delta R \quad (10)$$

$$\Delta g = \left(\frac{C_0}{g^{\gamma-1}}\right)\Delta G \quad (11)$$

$$\Delta b = \left(\frac{C_0}{b^{\gamma-1}}\right)\Delta B \quad (12)$$

Wherein $$C_0 = \left(\frac{\gamma}{(cv_{max})^2}\right)$$

and $cv_{max}$ is 255 for an 8 bit system; ΔR, ΔG and ΔB are linearized color channel difference values; Δr, Δg and Δb are code domain color channel difference values and γ is a display target gamma value.

In some embodiments, once the code domain color channel code difference values are determined, they may be used to adjust 48 the previously used color channel code values for the control point. These adjusted color channel code values may then be displayed on the display where they can be measured with a calorimeter or similar device. The difference between the measured chromaticity produced with the adjusted color channel code values and the target chromaticity may be determined 43 and this process may iterate until the measured values are within tolerance 44.

Figure 5:
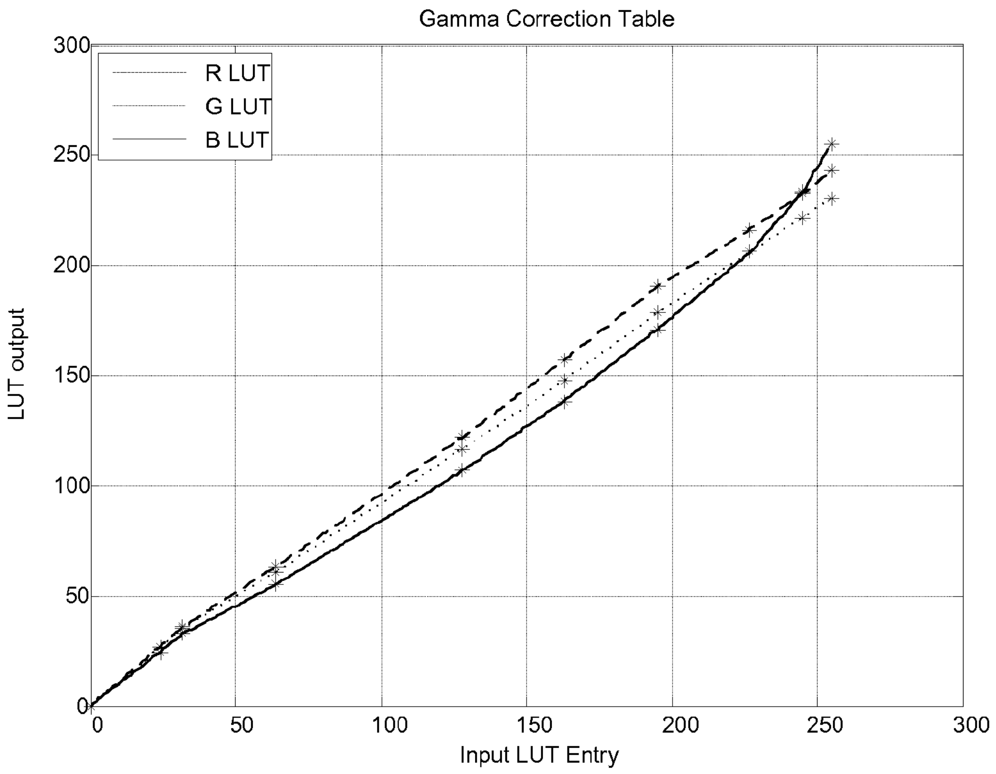
FIG. 5 is a plot showing exemplary color channel gamma correction tables.

The processes described above may result in control points that define one or more gamma correction curves as shown in FIG. 5. These correction curves may be represented as a look-up table (LUT) that may be implemented in a display or other color reproduction device. In some embodiments, correction curves may be generated for each color channel.

Figure 6:
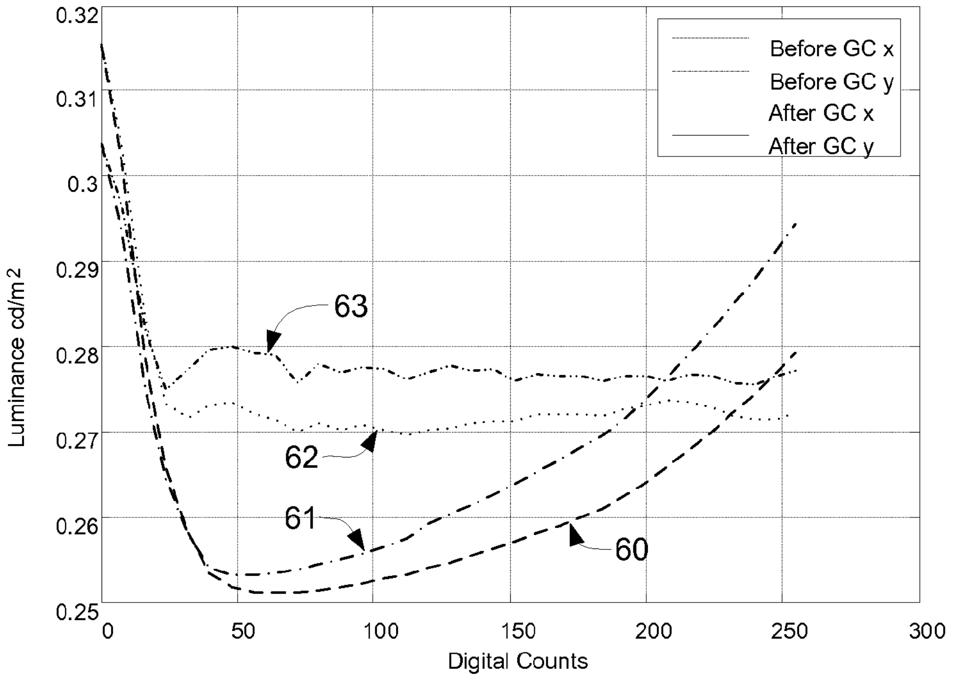
FIG. 6 is a graph showing chromaticity as a function of gray level before and after an exemplary gamma correction process.

FIG. 6 is a diagram showing chromaticity as a function of gray level for an uncorrected display 60, 61 and a corrected display 62, 63 using an exemplary embodiment of the present invention.

Figure 7:
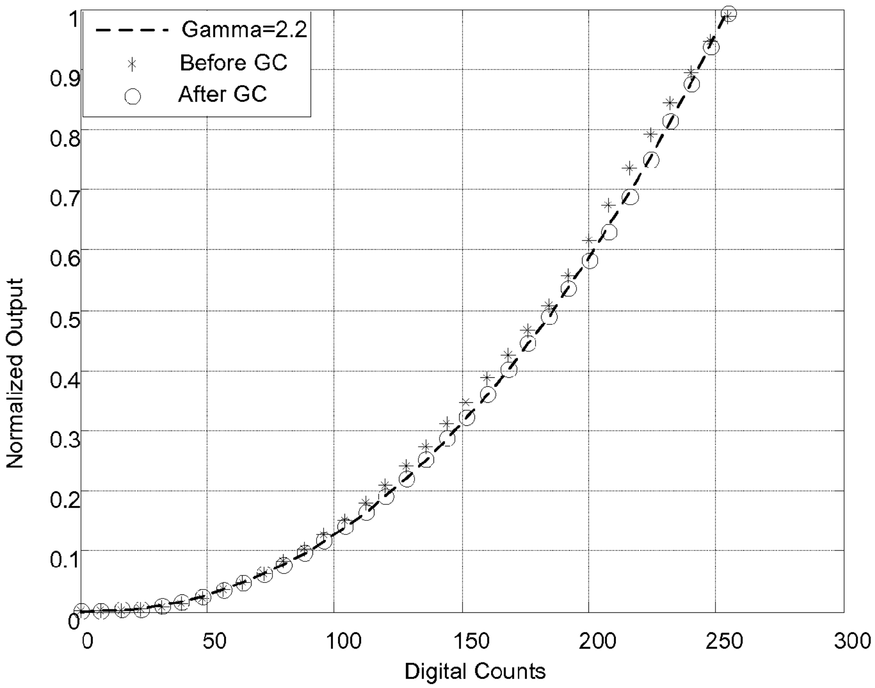
FIG. 7 is a graph showing display output as a function of gray level before and after an exemplary gamma correction process.

FIG. 7 shows an exemplary display output as a function of gray level. This plot demonstrates how an exemplary embodiment of the present invention can generate a correction that more closely follows a target gamma curve while providing proper white balance.

Figure 8:
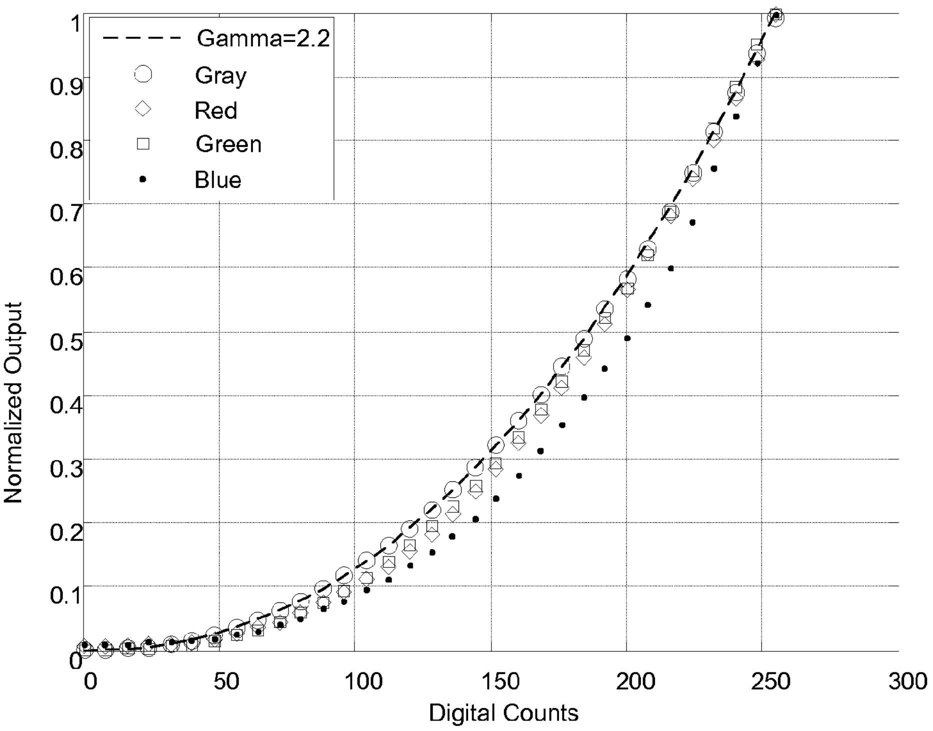
FIG. 8 is a graph showing tone curves of RGB and gray after gamma correction with an exemplary embodiment.

FIG. 8 is a diagram showing tone curves of RGB and gray after gamma correction.

The terms and expressions which have been employed in the foregoing specification are used therein as terms of description and not of limitation, and there is no intention in the use of such terms and expressions of excluding equivalence of the features shown and described or portions thereof, it being recognized that the scope of the invention is defined and limited only by the claims which follow.

What is claimed is:

1. A method for selecting display white point code values, said method comprising:

a) displaying on a display device a color produced using maximum code values for each color channel of said display device;

b) measuring said color as displayed on said display device to determine measured chromaticity coordinates;

c) comparing said measured chromaticity coordinates with target chromaticity coordinates to determine a chromaticity difference;

d) determining whether said chromaticity difference is within a chromaticity tolerance;

e) when said chromaticity difference is within said chromaticity tolerance, using said maximum code values as white point code values;

f) when said chromaticity difference is not within said chromaticity tolerance, calculating new linearized color channel code values, wherein said calculating comprises multiplying an XYZ to RGB conversion matrix with a column vector comprising measured chromaticity coordinates modified with target chromaticity values;

g) converting said linearized color channel code values to new color channel code values;

h) displaying said new color channel code values on said display;

i) measuring the output of said display when displaying said new color channel code values thereby creating new chromaticity coordinates;

j) comparing said new chromaticity coordinates with target chromaticity coordinates to determine an adjusted chromaticity difference; and k) repeating steps e) through j) until said adjusted chromaticity difference is within said chromaticity tolerance.

2. A method as described in claim 1 wherein said measuring is performed with a colorimeter.

3. A method as described in claim 1 wherein said adjusting comprises using the following equation:

$$\begin{bmatrix} R \\ G \\ B \end{bmatrix} = 1 - XYZ2RGB_{3x3} \begin{bmatrix} X - \frac{x_0}{y_0} Y \\ 0 \\ Z - \frac{(1 - x_0 - y_0)}{y_0} Z \end{bmatrix},$$

wherein R, G and B are linearized color channel values; XYZ2RGB is an XYZ to RGB conversion matrix; X, Y and Z are measured chromaticity coordinates based on the previously displayed color channel values and $x_0$ and $y_o$ are target chromaticity coordinates.

4. A method as described in claim 1 wherein said converting comprises converting said linearized RGB coordinates into rgb code domain coordinates.

5. A method as described in claim 1 wherein said converting comprises using the following equations:

$$r = 255\left(\frac{R}{\max R}\right)^{\frac{1}{\gamma}} \quad g = 255\left(\frac{G}{\max G}\right)^{\frac{1}{\gamma}} \quad b = 255\left(\frac{B}{\max B}\right)^{\frac{1}{\gamma}}$$

to obtain rgb code domain coordinates, wherein R, G and B are linearized color coordinates, γ is a display target gamma value and r, g and b are code domain color coordinates.

6. A method for determining display device gamma correction curve control point coordinates, said method comprising:

a) selecting a gray level for a gamma curve control point for said display device;
b) generating target chromaticity coordinates for said control point based on said gray level;
c) displaying a color on said display device, said color having color channel code values equal to said gray level;
d) measuring display output when said color is being displayed, thereby creating display output chromaticity coordinates;
e) comparing said display output chromaticity coordinates with said target chromaticity coordinates, thereby determining a chromaticity difference;
f) when said chromaticity difference is within a chromaticity tolerance, using said color channel code values as control point color channel code values;
g) when said chromaticity difference is not within a chromaticity tolerance,
   i) determining linearized color channel difference values;
   ii) using said linearized color channel difference values to determine color channel code difference values;
   iii) adjusting said color channel code values with said color channel code difference values thereby creating adjusted color channel code values;
   iv) displaying said adjusted color channel code values; and
h) repeating steps d) through g) iv) until said chromaticity difference is within said chromaticity tolerance.

7. A method as described in claim 6 wherein said measuring display output comprises using a colorimeter.

8. A method as described in claim 6 wherein said generating target chromaticity coordinates for said control point based on said gray level comprises using the following equation:

$$\begin{bmatrix} X_i \\ Y_i \\ Z_i \end{bmatrix} = \left(\frac{gl_i}{255}\right)^{\gamma} Y_w \begin{bmatrix} x_0 / y_0 \\ 1 \\ (1 - x_0 - y_0) / y_0 \end{bmatrix},$$

wherein $gl_i$ is the gray level of the control point; $X_i$, $Y_i$ and $Z_i$ are target coordinates; $Y_w$ is the luminance value of the reference white point; γ is the target gamma value and $x_0$ and $y_o$ are target reference point chromaticity coordinates.

9. A method as described in claim 6 wherein said determining linearized color channel difference values comprises using the following equation:

$$\begin{bmatrix} \Delta R \\ \Delta G \\ \Delta B \end{bmatrix} = XYZ2RGB_{3x3} \begin{bmatrix} X - X_i \\ Y - Y_i \\ Z - Z_i \end{bmatrix},$$

wherein ΔR, ΔG and ΔB are linearized color channel difference values (e.g., $R = r/255)^{\gamma}$); XYZ2RGB is an XYZ to RGB conversion matrix; X, Y and Z are measured values based on the previously displayed color channel values; $X_i$, $Y_i$ and $Z_i$, are control point target values and $x_0$ and $y_0$ are target reference point chromaticity coordinates.

10. A method as described in claim 6 wherein said using said linearized color channel difference values to determine color channel code difference values comprises using the following equations:

$$\Delta r = \left(\frac{C_0}{r^{\gamma-1}}\right)\Delta R,\ \Delta g = \left(\frac{C_0}{g^{\gamma-1}}\right)\Delta G \text{ and } \Delta b = \left(\frac{C_0}{b^{\gamma-1}}\right)\Delta B,$$

wherein $$C_0 = \left(\frac{\gamma}{(cv_{max})^2}\right)$$

and $cv_{max}$ is a maximum code value (e.g., 255 for an 8 bit system); ΔR, ΔG and ΔB are linearized color channel difference values; Δr, Δg and Δb are code domain color channel difference values, r, g and b are color channel code values and γ is a display target gamma value.

11. A method as described in claim 6 further comprising selecting a second gray level and repeating steps b) through h) to find second control point color channel values for said second control point.

12. A method as described in claim 11 further comprising creating a gamma correction curve comprising said control point and said second control point.

13. A method for determining display device gamma curve control point coordinates, said method comprising:

a) determining display white point code values, said determining comprising
   (1) displaying on a display device a color produced using maximum code values for each color channel of said display device;
   (2) measuring said color as displayed on said display device to determine measured white point chromaticity coordinates;
   (3) comparing said measured white point chromaticity coordinates with reference white point chromaticity coordinates to determine a white point chromaticity difference;

(4) determining whether said white point chromaticity difference is within a white point chromaticity tolerance;

(5) when said white point chromaticity difference is within said white point chromaticity tolerance, using said displayed color channel code values as white point code values;

(6) when said chromaticity difference is not within said chromaticity tolerance, adjusting said displayed color channel color values, wherein said adjusting comprises determining linearized color channel coordinates, said determining comprising multiplying an XYZ to RGB conversion matrix with a column vector comprising measured chromaticity coordinates modified with reference white point chromaticity coordinates;

(7) converting said linearized color channel coordinates to color channel code values;

(8) displaying said color channel code values on said display;

(9) measuring the output of said display when displaying said color channel code values thereby creating adjusted white point chromaticity coordinates;

(10) comparing said adjusted white point chromaticity coordinates with reference white point chromaticity coordinates to determine an adjusted white point chromaticity difference; and

(11) repeating steps (4) through (10) until said adjusted white point chromaticity difference is within said white point chromaticity tolerance;

b) selecting a gray level for a gamma curve control point for said display device;

c) generating target control point chromaticity coordinates for said control point based on said gray level;

d) displaying a candidate control point color on said display device, said candidate control point color having candidate control point color channel code values equal to said gray level;

e) measuring display output when said candidate control point color is being displayed, thereby creating display output control point chromaticity coordinates;

f) comparing said display output control point chromaticity coordinates with said target control point chromaticity coordinates, thereby determining a control point chromaticity difference;

g) when said control point chromaticity difference is within a control point chromaticity tolerance, using said candidate control point color channel code values as control point color channel code values;

h) when said control point chromaticity difference is not within a control point chromaticity tolerance, (1) determining linearized control point color channel difference values;

(2) using said linearized control point color channel difference values to determine control point color channel code difference values;

(3) adjusting said control point color channel code values with said control point color channel code difference values thereby creating adjusted control point color channel code values;

(4) displaying said adjusted control point color channel code values;

i) repeating steps e) through h) (4) until said control point chromaticity difference is within said chromaticity tolerance;

j) forming a gamma correction curve comprising a white point with white point code values determined in step a) and a control point with control point color channel values determined with a method comprising steps b) through i).

14. A method as described in claim 13 wherein said adjusting comprises using the following equation:

$$\begin{bmatrix} R \\ G \\ B \end{bmatrix} = 1 - XYZ2RGB_{3x3} \begin{bmatrix} X - \frac{x_0}{y_0} Y \\ 0 \\ Z - \frac{(1 - x_0 - y_0)}{y_0} Z \end{bmatrix},$$

wherein R, G and B are linearized color channel values; XYZ2RGB is an XYZ to RGB conversion matrix; X, Y and Z are measured chromaticity coordinates based on the previously displayed color channel values and $x_0$ and $y_0$ are target chromaticity coordinates.

15. A method as described in claim 13 wherein said wherein said converting comprises converting said linearized RGB coordinates into rgb code domain coordinates.

16. A method as described in claim 13 wherein said converting comprises using the following equations:

$$r = 255\left(\frac{R}{\max R}\right)^{\frac{1}{\gamma}} \quad g = 255\left(\frac{G}{\max G}\right)^{\frac{1}{\gamma}} \quad b = 255\left(\frac{B}{\max B}\right)^{\frac{1}{\gamma}}$$

to obtain rgb code domain coordinates, wherein R, G and B are linearized color coordinates, γ is a display target gamma value and r, g and b are code domain color coordinates.

17. A method as described in claim 13 wherein said wherein said generating target chromaticity coordinates for said control point based on said gray level comprises using the following equation:

$$\begin{bmatrix} X_i \\ Y_i \\ Z_i \end{bmatrix} = \left(\frac{gl_i}{255}\right)^{\gamma} Y_w \begin{bmatrix} x_0 / y_0 \\ 1 \\ (1 - x_0 - y_0) / y_0 \end{bmatrix},$$

wherein $gl_i$ is the gray level of the control point; $X_i$, $Y_i$ and $Z_i$ are target coordinates; $Y_w$ is the luminance value of the reference white point; γ is the target gamma value and $x_0$ and $y_0$ are target reference point chromaticity coordinates.

18. A method as described in claim 13 wherein said determining linearized color channel difference values comprises using the following equation:

$$\begin{bmatrix} \Delta R \\ \Delta G \\ \Delta B \end{bmatrix} = XYZ2RGB_{3x3} \begin{bmatrix} X - X_i \\ Y - Y_i \\ Z - Z_i \end{bmatrix},$$

wherein ΔR, ΔG and ΔB are linearized color channel difference values (e.g., $R=(r/255)^{\gamma}$); XYZ2RGB is an XYZ to RGB conversion matrix (e.g., from equation 2); X, Y and Z are measured values based on the previously displayed color channel values; $X_i$, $Y_i$ and $Z_i$, are control point target values and $x_0$ and $y_0$ are target reference point chromaticity coordinates.

19. A method as described in claim 13 wherein said using said linearized color channel difference values to determine color channel code difference values comprises using the following equations:

$$\Delta r = \left(\frac{C_0}{r^{\gamma-1}}\right)\Delta R, \ \Delta g = \left(\frac{C_0}{g^{\gamma-1}}\right)\Delta G \text{ and } \Delta b = \left(\frac{C_0}{b^{\gamma-1}}\right)\Delta B,$$

wherein $$C_0 = \left(\frac{\gamma}{(cv_{max})^2}\right)$$

and $cv_{max}$ is a maximum code value (e.g., 255 for an 8 bit system); ΔR, ΔG and ΔB are linearized color channel difference values; Δr, Δg and Δb are code domain color channel difference values, r, g and b are color channel code values and γ is a display target gamma value.

20. A method as described in claim 13 further comprising determining second control point color channel values for a second control point and wherein said gamma correction curve further comprises said second control point.

* * * * *